United States Patent [19]

Allen

[11] Patent Number: 5,686,737

[45] Date of Patent: Nov. 11, 1997

[54] SELF-ALIGNED FIELD-EFFECT TRANSISTOR FOR HIGH FREQUENCY APPLICATIONS

[75] Inventor: Scott T. Allen, Morrisville, N.C.

[73] Assignee: Cree Research, Inc., Durham, N.C.

[21] Appl. No.: 307,173

[22] Filed: Sep. 16, 1994

[51] Int. Cl.$^6$ .............................................. H01L 31/0312
[52] U.S. Cl. ................................................. 257/77; 257/282
[58] Field of Search ................................. 257/76, 77, 200, 257/201, 347, 352, 401, 507, 622, 624

[56] References Cited

U.S. PATENT DOCUMENTS

| | | | |
|---|---|---|---|
| 4,757,028 | 7/1988 | Kondoh et al. | 437/40 |
| 4,762,806 | 8/1988 | Suzuki et al. | 437/100 |
| 4,833,508 | 5/1989 | Ishikawa et al. | 257/24 |
| 4,865,685 | 9/1989 | Palmour | 156/643 |
| 4,912,063 | 3/1990 | Davis et al. | 437/100 |
| 4,912,064 | 3/1990 | Kong et al. | 437/100 |
| 4,929,985 | 5/1990 | Takasaki | 257/77 |
| 4,946,547 | 8/1990 | Palmour et al. | 156/643 |
| 4,981,551 | 1/1991 | Palmour | 156/643 |
| 5,011,549 | 4/1991 | Kong et al. | 148/33.1 |
| 5,072,264 | 12/1991 | Jones | 257/77 |
| 5,087,576 | 2/1992 | Edmond et al. | 437/22 |
| 5,184,199 | 2/1993 | Fujii et al. | 257/77 |
| 5,200,022 | 4/1993 | Kong et al. | 156/612 |
| 5,229,625 | 7/1993 | Suzuki et al. | 257/77 |
| 5,264,713 | 11/1993 | Palmour | 257/76 |
| 5,270,554 | 12/1993 | Palmour | 257/77 |
| 5,274,251 | 12/1993 | Ota et al. | 257/76 |
| 5,326,991 | 7/1994 | Takasu | 257/77 |
| 5,382,809 | 1/1995 | Nishibayashi et al. | 257/77 |
| 5,382,822 | 1/1995 | Stein | 257/76 |
| 5,393,993 | 2/1995 | Edmond et al. | 257/103 |
| 5,536,953 | 7/1996 | Driefus et al. | 257/77 |

FOREIGN PATENT DOCUMENTS

| | | |
|---|---|---|
| 1312148 | 12/1992 | Canada . |
| 0 342 866 | 11/1989 | European Pat. Off. . |
| 0 518 683 | 12/1992 | European Pat. Off. . |
| 4-167477 | 6/1992 | Japan .................................. 257/77 |
| WO 94/13017 | 6/1994 | WIPO . |

OTHER PUBLICATIONS

Weitzel et al. "4H-S.C MESFET with 2.8 W/mm Power Density at 1.8 GHZ," IEEE Electron Device Letters, vol. 15, No. 10, Oct. 1994, pp. 406–407.

6-H-SiC MESFET Devices Using n+ Capping Layers; P. G. Young et al., Institute of Physics Conference Series No. 137: Chapter 6; Silicon Carbide and Related Materials, Proceedings of the Fifth Conference, Washington, DC, Nov. 1993, pp. 667–670.

Neudeck et al., *Silicon Carbide Buried–Gate Junction Field–Effect Transistors for High–Temperature Power Electronic Applications*, Transactions, Second International High Temperature Electronics Conference, Volume One, Jun. 5–10, 1994, Charlotte, North Caroline, pp. X–23–X–28.

Primary Examiner—Mark V. Prenty
Attorney, Agent, or Firm—Philip Summa Patent Attorney

[57] ABSTRACT

A metal-semiconductor field-effect-transistor (MESFET) is disclosed that exhibits reduced source resistance and higher operating frequencies. The MESFET comprises an epitaxial layer of silicon carbide, and a gate trench in the epitaxial layer that exposes a silicon carbide gate surface between two respective trench edges. A gate contact is made to the gate surface, and with the trench further defines the source and drain regions of the transistor. Respective ohmic metal layers form ohmic contacts on the source and drain regions of the epitaxial layer, and the edges of the metal layers at the trench are specifically aligned with the edges of the epitaxial layer at the trench.

16 Claims, 1 Drawing Sheet

1

SELF-ALIGNED FIELD-EFFECT TRANSISTOR FOR HIGH FREQUENCY APPLICATIONS

FIELD OF THE INVENTION

The present invention relates to field-effect transistors ("FETs") in wide bandgap materials, and particularly relates to a self-aligned metal-semiconductor field-effect transistor (MESFET) structure formed in silicon carbide that provides advantages in high frequency operation.

BACKGROUND OF THE INVENTION

The metal-semiconductor field-effect transistor is one of a family of field-effect devices, the three main types of field-effect transistors being junction field-effect transistors (JFETs), metal-oxide-semiconductor field-effect transistors (MOSFETs), and MESFETs.

As known to those familiar with semiconductor devices, JFETs and MESFETs operate identically to one another, the difference being that a MESFET uses a metal-semiconductor rectifying contact for the gate electrode instead of a p-n junction. Each of these structures offer certain processing and performance advantages. For MESFETS, these advantages potentially include low temperature formation of the gate structure (as compared to the generally more sophisticated formation of p-n junctions), low resistance and low current-resistance ("IR") drop along the channel width, and good heat dissipation for power devices. Alternatively, a MESFET's metal contact structure is more susceptible to leakage current, particularly at high temperatures, so that JFETs can often operate at higher temperatures than MESFETS.

As just noted, the general theory and operations of JFETs and MESFETs are well understood. An illustrative discussion is set forth, for example, in Chapter 6 of Sze, Physics of Semiconductor Devices, 2nd Edition (1981).

Metal-semiconductor field-effect transistors are particularly useful for high frequency applications. Such applications include electrical circuits requiring high power handling capability (greater than 20 watts) while operating a high frequencies such as radio frequencies (500 megahertz), S-band frequencies (3 gigahertz), and X-band frequencies (10 gigahertz), the use of which has become more prevalent in recent years. Because of the increase in high power, high frequency circuits, demand has correspondingly increased for transistors capable of operating reliably at radio and higher frequencies while still handling higher power loads. Previously, bipolar transistors and power MOSFETs have been used for high power applications, but the power handling capability of such devices is generally limited at higher operating frequencies.

The MESFET structure is preferred for high frequency applications because only the majority carriers carry current. The MESFET design is also preferred over current MOSFET designs because the reduced gate capacities permit faster switching of the gate input. Therefore, although all field-effect transistors utilize only majority carriers to carry current, a MESFET's Schottky gate structure makes the MESFET more desirable for high frequency applications.

In addition to the device structure, the characteristics of the semiconductor material from which a transistor is formed also affect the operating parameters. Such semiconductor characteristics include electron mobility, saturated electron drift velocity, electric breakdown field, and thermal conductivity.

For many years, most high frequency MESFETs have been manufactured of n-type III–V compounds such as gallium arsenide (GaAs) because of their high electron mobilities. Although these devices provided increased operating frequencies and moderately increased power handling capability, their relatively low breakdown voltage and their lower thermal conductivity have limited their usefulness in high power applications.

Silicon carbide (SIC) has been known for many years to possess excellent physical and electronic properties which theoretically should provide the basis for electronic devices that can operate at higher temperatures, and higher power at high frequencies than devices produced from silicon or gallium arsenide. Silicon carbide has an electric breakdown field of about $4 \times 10^6$ volts per centimeter, a saturated electron drift velocity of about $2.0 \times 10^7$ centimeters per second, and a high thermal conductivity of about 4.9 watts per centimeter-Kelvin, all of which makes silicon carbide suitable for high frequency, high power applications.

Silicon carbide is notoriously difficult to work with, however, particularly because of the high processing temperatures required to grow it, its physical hardness, and its characteristic crystallization in approximately 150 polytypes, most of which are separated by relatively small thermodynamic differences.

More recently, however, progress in silicon carbide research has provided the practical success in device manufacture to match silicon carbide's theoretical potential. In particular, U.S. Pat. No. 5,270,554 and Canadian Patent No. 1,312,148, the contents of both of which are incorporated entirely herein by reference, disclose successful MESFETs in silicon carbide. Both of these patents represent developments carried out by the assignee of the present invention. The '554 U.S. patent is assigned to the present assignee, and the '148 Canadian patent is exclusively licensed to the present assignee. Canadian Patent No. 1,312,148 also claims priority from U.S. application Ser. No. 07/540,488, filed Jun. 19, 1990 (now abandoned) which is also incorporated entirely herein by reference.

Additionally, interest is increasing in other wide bandgap semiconductor materials such as Group III nitrides (i.e., Group III of the periodic table), including binary compounds such as gallium nitride (GAN), and ternary and quaternary nitrides such as GaAlN and InGaAlN.

In seeking improvements in these devices, careful evaluation of their properties has shown that much of the source and drain resistance in MESFETs formed in silicon carbide results from the physical gap between the ohmic contact metal layer and the gate contact. More specifically, recent careful analysis of existing devices has revealed that approximately half of the source resistance of current silicon carbide MESFETs results from this gap.

As is known to those familiar with present manufacturing techniques for semiconductor devices, this gap is on the order of about 1 micron. This represents the current smallest tolerance that can be achieved using the masking and etching steps by which semiconductor devices of all types, including those formed in silicon carbide, are typically formed. Thus, although a tolerance as small as 1 micron is generally considered to be excellent in many respects, it has now been discovered that this very small gap contributes significantly to the source resistance of the device.

As known to those familiar with semiconductor devices and particularly JFETs and MESFETs, the increased source resistance in turn lowers the potential gain and power efficiency of a MESFET at microwave frequencies. Perhaps most fundamentally, the increased source resistance also lowers the maximum operating frequency, $F_{max}$.

There thus exists the need to reduce the source resistance in JFETs and MESFETs formed in silicon carbide and Group III nitrides in a manner which will increase their gain, their efficiency, and their maximum operating frequencies.

OBJECT AND SUMMARY OF THE INVENTION

Therefore, it is an object of the present invention to provide a field effect transistor with reduced source resistance and a corresponding increase in gain, power efficiency, and $F_{max}$.

The invention meets these objects with a metal-semiconductor field-effect transistor (MESFET) that comprises an epitaxial layer of silicon carbide having a first conductivity type. A gate trench in the epitaxial layer exposes the silicon carbide gate surface between two respective trench edges, and the trench further defines the source and the drain regions of the transistor. A rectifying gate contact is on the gate surface, and respective ohmic metal layers form ohmic contacts on the source and drain regions of the epitaxial layer. The edges of these ohmic metal layers at the trench are specifically aligned with the edges of the trench in the epitaxial layer.

In another aspect, the invention comprises a method of forming such a self-aligned metal-semiconductor field-effect transistor in silicon carbide.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein.

DETAILED DESCRIPTION

Figure 1:
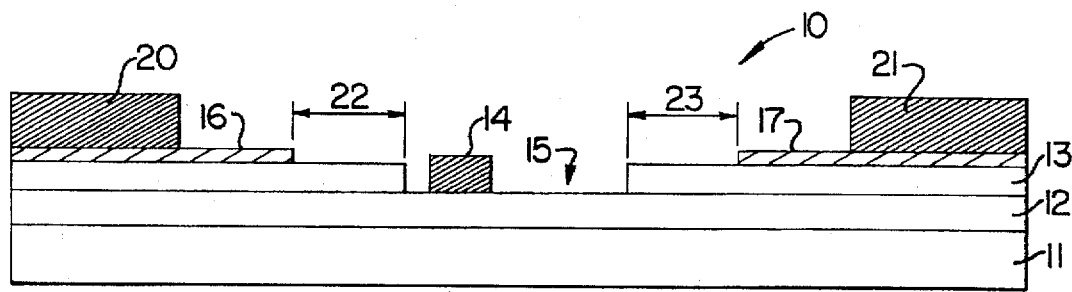
FIG. 1 is a cross-sectional view of a prior art MESFET.

FIG. 1 is a representation of a typical MESFET formed in silicon carbide and broadly designated at 10. The device 10 includes a silicon carbide substrate 11, and an epitaxial layer of silicon carbide illustrated in FIG. 1 in two portions as the channel layer 12 and the cap layer 13. It will be understood, however, that a single layer could suffice. In typical MESFETs, both the channel layer 12 and the cap layer 13 are usually n-type conductivity. The gate contact is illustrated at 14 and is positioned in the trench broadly designated at 15 formed in the cap layer 13.

In order to provide ohmic contact to the source and drain regions, a metal suitable for an ohmic contact is deposited on the cap layer and is designated as portions 16 and 17 to distinguish the source portion 16 from the drain portion 17. Typically, an interconnect metal shown as the portions 20 (for the source) and 21 (for the drain) complete the device structure.

As is known to those familiar with the manufacture of such devices, a typical method for building the device of FIG. 1 is to first grow the epitaxial cap layer 13 on the channel layer 12. The gate trench 15 is next etched, after which the structure is masked and the ohmic metal (nickel or a nickel alloy being typical examples for silicon carbide) is deposited to make the ohmic contacts. The physical limitations of working in such small dimensions are such that it has been difficult to date to align the mask for the metal any closer to the trench than about 1 micron. As a result, a source gap designated at 22 and a drain gap designated at 23 are present on the cap layer 13 between the edge of the respective metal portions 16 and 17 and the edges of the gate trench 15.

As foreshadowed earlier, it has now been discovered that although a FET's source resistance is a product of several factors, the largest factor—one which contributes approximately half of the source resistance—is this gap 22 along the cap layer 13 between the ohmic contacts 16 and the trench 15.

The invention eliminates this gap 22 and thus eliminates approximately half of the source resistance.

Figure 2:
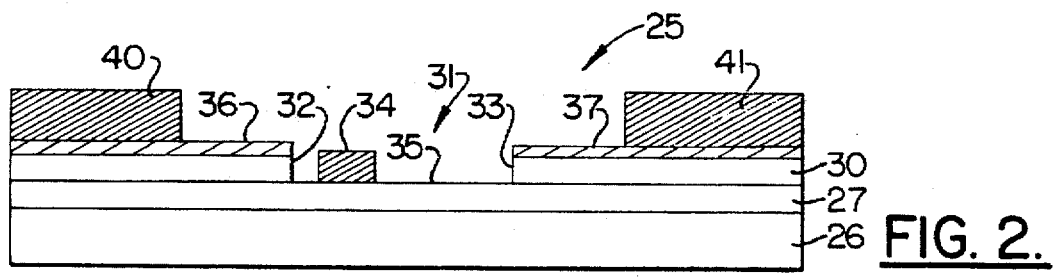
FIG. 2 is a cross-sectional view of a MESFET according to the present invention.

FIG. 2 illustrates the structure of the invention and shows a MESFET broadly designated at 25. The invention is preferably supported by a silicon carbide substrate 26. Those familiar with wide bandgap materials and devices will recognize, however, that devices such as this have been formed on other substrate materials such as sapphire, silicon, or even diamond, and thus the invention encompasses such substrates. Silicon carbide is preferred, however, because it can provide an exact lattice match with the silicon carbide epitaxial layers to be grown upon it.

An epitaxial layer of silicon carbide having a first conductivity type is formed on the epitaxial layer 26. In the preferred embodiment of the invention, and as illustrated in FIG. 2, the epitaxial layer is formed of a channel layer 27 and a cap layer 30, both having n-type conductivity. As noted earlier, a single epitaxial layer could suffice.

The epitaxial layer has a gate trench broadly designated at 31 that exposes a silicon carbide gate surface between two respective trench edges 32 and 33. The trench thus further defines the source and drain regions of the transistor. A rectifying gate contact 34 is made to the gate surface 35 to define the gate region of the transistor, and respective ohmic metal layers 36 and 37 form ohmic contacts on the source and drain regions of the cap epitaxial layer 30. As illustrated by FIG. 2, the edges of the metal layers 36 and 37 are specifically aligned with the edges 32 and 33 of the trench 31 in the epitaxial layer 30. Interconnect metal portions 40 and 41 are also shown in FIG. 2 and, providing they are compatible with the ohmic contact metal layers 36 and 37, can be selected in an appropriate manner from a number of high conductivity metals well known in this art, including gold (Au), silver (Ag), aluminum (Al), and copper (Cu).

As for the ohmic contact metal layers 36 and 37, an appropriate contact material is qualified functionally as one that provides ohmic behavior with the semiconductor, and one that doesn't react unfavorably with the etchant. For a FET in silicon carbide, the ohmic contact preferably comprises a nickel (Ni) alloy that is formed by depositing nickel on the SiC surface and then annealing it. As-deposited aluminum (Al) will also form an ohmic contact to SiC.

Similarly, the gate contact can be selected from the group consisting of gold, platinum (Pt), platinum silicide, and titanium, and in a preferred embodiment comprises platinum. In preferred embodiments, a gold overlay covers the platinum gate contact, and successive layers of titanium, platinum, and gold overlay the annealed nickel ohmic contacts.

As well known to those familiar with the crystal structure advantages of semiconductor devices, the substrate 26, the channel layer 27, and the cap layer 30 are all preferably formed of the same polytype of silicon carbide, and these are generally selected from the group consisting of the 3C, 2H, 4H, 6H, and 15R polytypes of silicon carbide, with the understanding that bulk single crystal substrates of 3C silicon carbide are generally more difficult to form.

In the Group III nitride embodiments of the device, the substrate can be silicon carbide, and if a buffer layer of aluminum nitride (not shown) is included between the substrate and the FET structure, the silicon carbide substrate can be n or p-type, semi-insulating, or even substantially undoped. Sapphire is an appropriate alternative substrate material, and is insulating in character.

In order to enhance the operation of the device, the cap layer 30 typically has a higher carrier concentration than the channel layer 27, and both are generally formed of n-type silicon carbide.

As further known to those familiar with MESFET operation, the substrate 26 is preferably semi-insulating in character, although it can also have the opposite conductivity type from the epitaxial layers 27 and 30. Thus, when the epitaxial layers are preferably n-type, the substrate will be either semi-insulating or p-type. In yet other embodiments, a p-type, semi-insulating, or even substantially undoped epitaxial layer (not shown) can provide a buffer between the substrate and the FET so that the conductivity of the substrate does not affect the performance of the remainder of the structure; i.e.; can be n-type, p-type, or semi-insulating.

As FIG. 2 illustrates, because the edges of the ohmic contact layers 36 and 37 are aligned with the edges 32 and 33 of the trench 31, the gaps shown at 22 and 23 in FIG. 1 are eliminated, thus immediately eliminating approximately fifty percent of the source resistance in the transistor.

Figure 4:
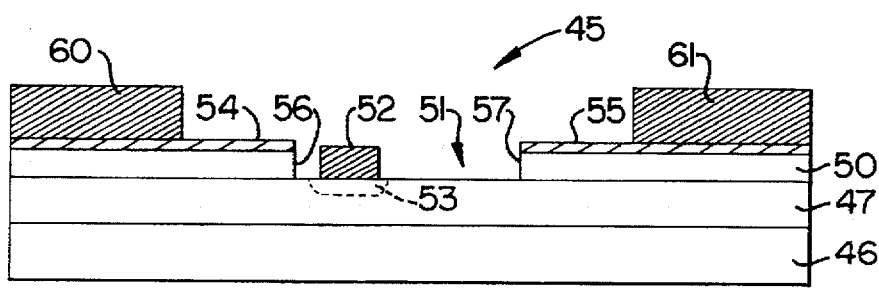
FIG. 4 is a cross-sectional view of a JFET according to the present invention.

FIG. 4 is a cross-sectional view of a junction field-effect transistor (JFET) according to the present invention. As in the MESFET embodiment illustrated in FIG. 2, the JFET of FIG. 4, broadly designated at 45, includes a substrate 46, a channel epitaxial layer 47, and a cap epitaxial layer 50. A trench 51 is formed in the cap layer 50 and includes a gate contact 52 which can be of an appropriate ohmic metal, rather than a Schottky metal. In the embodiment shown in FIG. 4, a p-n junction is formed by an implanted well 53 of p-type material in the n-type channel layer 47 prior to adding the gate contact 52. As in the previous embodiments, the ohmic contact metals 54 and 55 respectively are aligned with the edges 56 and 57 of the trench 51. Interconnect metals 60 and 61 complete the structure.

In another aspect, the invention comprises a method of forming the self-aligned metal-semiconductor field-effect transistor of the present invention. The first step comprises depositing an ohmic contact metal layer on an epitaxial layer of silicon carbide in a pattern that defines a gate trench location at which the epitaxial layer is exposed between portions of the ohmic contact metal layer.

The second step comprises etching a gate trench through the epitaxial layer of silicon carbide with an etchant and process that do not remove the ohmic contact metal layer. As a result, the metal layer effectively masks portions of the silicon carbide epitaxial layer to thereby self-align the edges of the metal and the edges of the trench in the silicon carbide layer to form the source and drain regions. A gate contact is then applied to the epitaxial layer at the bottom of the trench.

In sequential fashion, the method can further comprise the step of forming the epitaxial layer of silicon carbide supported by a silicon carbide substrate prior to the step of depositing the layer of ohmic contact metal. In turn, the step of forming an epitaxial layer can comprise the steps of forming an epitaxial channel layer of silicon carbide on the substrate, and then forming an epitaxial cap layer of silicon carbide on the epitaxial channel layer of silicon carbide.

Figure 3:
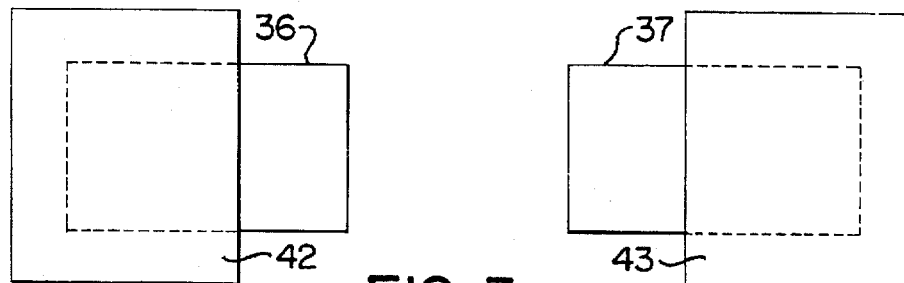
FIG. 3 is a schematic top plan view of a masking pattern according to the method of the invention.

The method can further comprise masking a portion of the ohmic contact layer prior to the step of etching the gate trench to thereby provide portions of the ohmic contact layer that are unaffected by the etch and thus more suitable for providing further interconnecting source and drain contacts to the ohmic contact layer. FIG. 3 illustrates such a masking pattern in which the ohmic contact metal layers 36 and 37 identically corresponding to the same reference numerals in FIG. 3 are shown as having portions schematically covered by the masks 42 and 43 respectively. Although typical etchants for silicon carbide do not usually remove annealed nickel and some other metals, the etchants will often tend to react to some degree with the metal surface and make it less suitable for further electrical contact. Thus, by masking a portion of the nickel during the etching step, a better surface is preserved for later adding the interconnect metal.

As in the structural embodiments, the step of depositing the ohmic contact metal preferably comprise depositing nickel and then annealing it. The step of applying a gate contact comprises applying a gate contact selected from the group consisting of gold, platinum, platinum silicide and titanium, and preferably platinum. Typical interconnect metals are selected for their high conductivity, and include gold, silver, aluminum, and copper.

In yet another embodiment of the invention, and using an etchant and process that will etch both silicon carbide and the ohmic contact metal (or a first etchant for the metal and a second etchant for the silicon carbide), the method can comprise etching a gate trench through the ohmic contact metal layer covering the epitaxial layer of silicon carbide and also through the silicon carbide layer to thereby self-align the edges of the metal and the edges of the trench in the silicon carbide layer. The gate contact is then applied to the epitaxial layer at the bottom of the trench as previously described.

The various process steps described herein can be carried out using techniques developed by the assignee of this invention. The growth of silicon carbide epitaxial layers of various types on various substrates are set forth in U.S. Pat. Nos. 4,912,063; 4,912,064; and 5,011,549, all of which are incorporated entirely herein by reference. The etching step can be carried out in accordance with the teachings of U.S. Pat. Nos. 4,865,685 and 4,981,551, the contents of which are incorporated entirely herein by reference. If desired, surface preparation can be carried out in accordance with U.S. Pat. Nos. 4,946,547 and 5,200,022, the contents of both of which are incorporated entirely herein by reference. Finally, if ion implantation is used to form any of the layers or junctions described herein, it can be carried out using the techniques described in U.S. Pat. No. 5,087,576, the contents of which are likewise incorporated entirely herein by reference.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A metal-semiconductor field-effect-transistor (MESFET) that exhibits reduced source resistance and higher operating frequencies, said MESFET comprising:

a silicon carbide substrate;

an n-type silicon carbide epitaxial channel layer on said substrate;

a semi-insulating epitaxial layer between said substrate and said epitaxial channel layer;

an n-type silicon carbide epitaxial cap layer on said channel layer, said cap layer defining a gate trench therein that exposes the upper surface of said channel layer between two respective vertical trench edges, and said trench further defining the source and drain regions of said transistor;

a rectifying gate contact to said upper surface of said channel layer;

respective ohmic metal layers forming ohmic contacts on said source and drain regions of said epitaxial cap layer;

said metal layers having their respective edges at the edge of said trench, said edges of said metal layers at said trench being specifically vertically aligned with said vertical trench edges of said epitaxial layer at said trench for eliminating the additional source resistance otherwise caused when said respective vertical trench edges of said epitaxial layer and said metal layers are not aligned; and an interconnect metal on said respective source and drain contacts.

2. A MESFET according to claim 1 wherein said ohmic metal comprises a nickel alloy.

3. A MESFET according to claim 1 wherein said gate contact is selected from the group consisting of: gold, platinum, platinum silicide, and titanium.

4. A MESFET according to claim 1 wherein said substrate, said channel layer, and said cap layer are all formed of the same polytype of silicon carbide.

5. A MESFET according to claim 4 wherein the silicon carbide polytype is selected from the group consisting of the 3C, 2H, 4H, 6H, and 15R polytypes of silicon carbide.

6. A MESFET according to claim 1 wherein said cap layer has a higher carrier concentration than said channel layer.

7. A MESFET according to claim 1 wherein said substrate is semi-insulating.

8. A MESFET according to claim 1 wherein said substrate is p-type.

9. A metal-semiconductor field-effect-transistor (MESFET) that exhibits reduced source resistance and higher operating frequencies, said MESFET comprising:

a silicon carbide substrate;

an n-type silicon carbide epitaxial channel layer on said substrate;

a substantially undoped epitaxial layer between said substrate and said epitaxial channel layer;

an n-type silicon carbide epitaxial cap layer on said channel layer, said cap layer defining a gate trench therein that exposes the upper surface of said channel layer between two respective vertical trench edges, and said trench further defining the source and drain regions of said transistor;

a rectifying gate contact to said upper surface of said channel layer;

respective ohmic metal layers forming ohmic contacts on said source and drain regions of said epitaxial cap layer;

said metal layers having their respective edges at the edge of said trench, said edges of said metal layers at said trench being specifically vertically aligned with said vertical trench edges of said epitaxial layer at said trench for eliminating the additional source resistance otherwise caused when said respective vertical trench edges of said epitaxial layer and said metal layers are not aligned; and an interconnect metal on said respective source and drain contacts.

10. A MESFET according to claim 9 wherein said ohmic metal comprises a nickel alloy.

11. A MESFET according to claim 9 wherein said gate contact is selected from the group consisting of: gold, platinum, platinum silicide, and titanium.

12. A MESFET according to claim 9 wherein said substrate, said channel layer, and said cap layer are all formed of the same polytype of silicon carbide.

13. A MESFET according to claim 12 wherein the silicon carbide polytype is selected from the group consisting of the 3C, 2H, 4H, 6H, and 15R polytypes of silicon carbide.

14. A MESFET according to claim 9 wherein said cap layer has a higher carrier concentration than said channel layer.

15. A MESFET according to claim 9 wherein said substrate is semi-insulating.

16. A MESFET according to claim 9 wherein said substrate is p-type.

* * * * *